United States Patent
Ricard et al.

(10) Patent No.: US 6,961,550 B2
(45) Date of Patent: Nov. 1, 2005

(54) RADIO RECEIVER THAT CHANGES FUNCTION ACCORDING TO THE OUTPUT OF AN INTERNAL VOICE-ONLY DETECTOR

(75) Inventors: Gary Ross Ricard, Chatfield, MN (US); James William Bonalumi, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 699 days.

(21) Appl. No.: 09/735,341

(22) Filed: Dec. 12, 2000

(65) Prior Publication Data

US 2002/0072341 A1  Jun. 13, 2002

(51) Int. Cl.[7] .............................................. H04B 1/18
(52) U.S. Cl. ............................. 455/186.1; 455/161.2; 455/174.1
(58) Field of Search ......................... 455/161.1, 167.2, 455/185.1, 186.1, 174.1, 194.1, 161.2

(56) References Cited

U.S. PATENT DOCUMENTS

| | | | | |
|---|---|---|---|---|
| 3,939,431 A | * | 2/1976 | Cohlman | 375/217 |
| 4,130,801 A | * | 12/1978 | Prygoff | 455/3.02 |
| 4,498,194 A | * | 2/1985 | Vandegraaf | 455/166.2 |
| 4,525,867 A | * | 6/1985 | Shiratani | 455/194.1 |
| 4,531,232 A | * | 7/1985 | Sakurai | 455/152.1 |
| 4,922,549 A | * | 5/1990 | Johnson et al. | 455/212 |
| 5,490,166 A | * | 2/1996 | Heinzelmann | 375/217 |
| 5,802,066 A | * | 9/1998 | Miyake et al. | 370/527 |
| 5,910,996 A | * | 6/1999 | Eggers et al. | 381/107 |
| 6,188,731 B1 | * | 2/2001 | Kim | 375/240.28 |
| 6,662,022 B1 | * | 12/2003 | Kanamori et al. | 455/556.1 |

\* cited by examiner

*Primary Examiner*—Nguyen T. Vo
*Assistant Examiner*—Nhan T. Le
(74) *Attorney, Agent, or Firm*—Martin & Associates, LLC; Derek P. Martin (57) ABSTRACT

A radio receiver includes a voice-only detection mechanism that detects when the current radio station is transmitting mostly voice, and that changes the function of the receiver depending on whether or not the current radio station is transmitting mostly voice. In a first embodiment, the radio receiver mutes its audio output when the voice-only detection mechanism detects a voice broadcast, or mutes its audio output when the voice-only detection mechanism detects a music broadcast. In a second embodiment, the radio receiver changes to a different radio station when a voice-only signal is detected, or when a music signal is detected. The second embodiment preferably includes a spectrum analyzer that can store a frequency spectrum "signature" of a radio signal, and a second tuner that scans the available radio stations for a signal that matches the stored signature.

4 Claims, 9 Drawing Sheets

RADIO RECEIVER THAT CHANGES FUNCTION ACCORDING TO THE OUTPUT OF AN INTERNAL VOICE-ONLY DETECTOR

BACKGROUND OF THE INVENTION

1. Technical Field

This invention generally relates to radio broadcasting and more specifically relates to radio receivers.

2. Background Art

For many decades, radio has been an important part of life in the United States, providing countless hours of news, entertainment, and music. Radio receivers typically receive radio signals from local radio stations that transmit their signal over an assigned frequency at or below a prescribed power level. Due to the power limitations imposed on radio transmissions, the range of a radio station is very limited. When a person gets into a vehicle to drive a long distance and tunes to a radio station, the reception on that radio station will typically degrade within an hour or two, forcing the driver to seek a new radio station. Manually scanning all the radio stations on the dial can be very annoying to a driver that wants to hear a particular type of radio program while driving. If the listener prefers country music, the listener must stop and listen to each station to determine if the station is playing country music. Likewise, if the listener prefers talk radio, the listener must listen to each station to determine whether the station is playing music or not, and if not, to determine whether the station is a talk radio station or is simply broadcasting a voice commercial or the voice of the disc jockey talking between songs.

Another aspect of known radio receivers is that there is currently no way to distinguish between different types of signals on the same radio station. In other words, once tuned to a radio station, the radio receiver simply transmits the audio output for that radio station to the listener. There is currently no known way to change the operational mode of a radio receiver based on the frequency spectrum of the signal being transmitted. Without a way for a user to mute unwanted radio programs or change stations to a different station that is playing the desired type of radio program, users will be forced to either listen to undesired programs, or to manually scan stations until a desired program is heard.

DISCLOSURE OF INVENTION

According to the preferred embodiments, a radio receiver includes a voice-only detection mechanism that detects when the current radio station is transmitting mostly voice, and that changes the function of the receiver depending on whether or not the current radio station is transmitting mostly voice. In a first embodiment, the radio receiver mutes its audio output when the voice-only detection mechanism detects a voice broadcast. The audio output can be enabled once again when the voice-only detection mechanism detects a non-voice signal. The first embodiment thus allows commercials and disk jockey talk to be automatically muted, with the volume returned to its previous level when music resumes. In a variation of the first embodiment, the radio receiver mutes its audio output when the voice-only detection mechanism detects a non-voice broadcast, and enables the audio output when the voice-only detection mechanism detects a voice signal, thereby allowing a listener to listen to talk radio while muting musical commercials. In a second embodiment, the radio receiver changes to a different radio station when a voice-only signal is detected. The second embodiment preferably includes a spectrum analyzer that can store a frequency spectrum "signature" of a radio signal, and a second tuner that scans the available radio stations for a signal that matches the stored frequency spectrum signature. This allows the radio receiver to automatically switch from a first radio station to a second radio station that is playing music that matches the preferences of the listener when the voice-only detection mechanism detects a mostly voice signal. In a variation of the second embodiment, the radio receiver may automatically switch from a first talk radio station to a second talk radio station when the voice-only detection mechanism detects a musical signal, indicating a commercial.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

Figure 1:
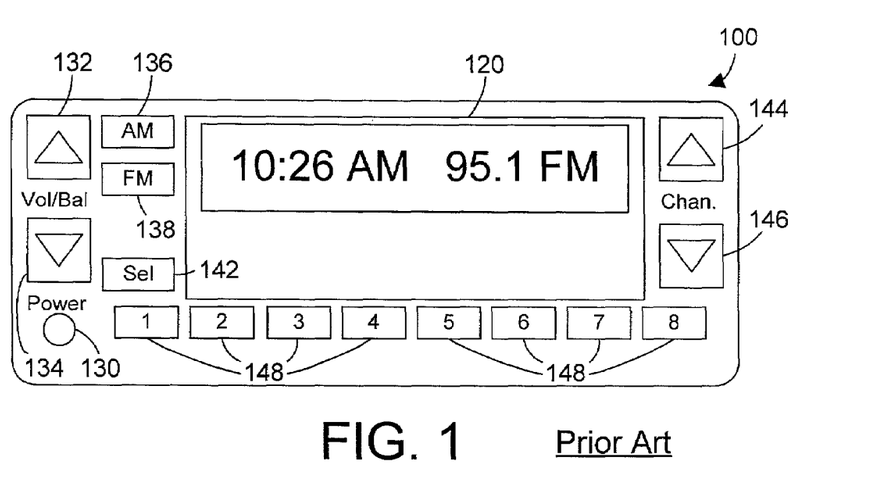
FIG. 1 is a front view of a prior art radio receiver.

Referring to FIG. 1, a radio receiver 100 in accordance with the prior art includes keys (or buttons) that change the function of the receiver 100, as well as a display 120. The buttons include a power button 130, a volume up button 132, a volume down button 134, an AM radio select button 136, an FM radio select button 138, and a select button 142 for selecting different modes, such as balance and fade adjustment, etc. Also included is a station up key 144, a station down key 146, and numerous station preset keys 148. Note that the buttons may take on different functions according to the selected mode for the radio receiver 100. For example, if balance mode is selected using select button 142, the volume up and down buttons 132 and 134 may be used to adjust the balance between the left and right speakers.

Display 120 generally includes information about the station currently being listened to, and may include a clock display as well, as shown in FIG. 1. For the example of FIG. 1, the selected radio station is 95.1 FM. Radio receiver 100 thus provides to the user a visual indication of what station is currently tuned in.

The preferred embodiments improve upon the prior art by providing a voice-only detector that detects when the broadcast signal from the current station becomes mostly voice, and provides a first output indication when the current station becomes mostly voice and a second output indication when the current station is no longer mostly voice. In addition, a radio receiver in accordance with the preferred embodiments may include a mechanism for setting a preferred frequency spectrum signature, and for automatically tuning to a different station whose current signal matches the preferred frequency spectrum signature when the current station no longer matches the preferred frequency spectrum signature. In this manner the radio receiver of the preferred embodiments may automatically switch to a different radio station that matches the preferred frequency spectrum signature, and may provide a "smart scan" feature where only the radio stations that have signals that match the preferred frequency spectrum signature are tuned in.

Figure 2:
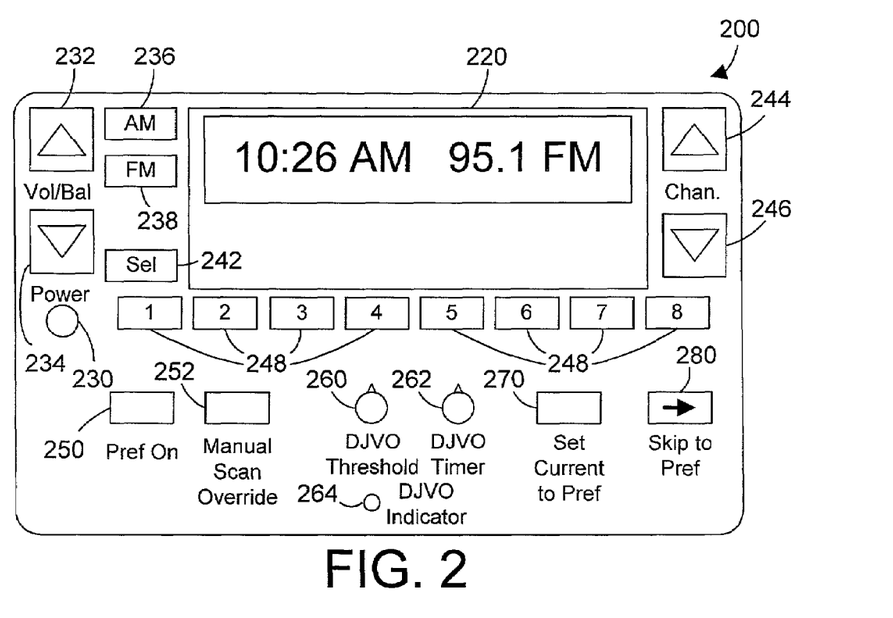
FIG. 2 is a front view of a radio receiver according to the preferred embodiments.

Referring now to FIG. 2, a radio receiver 200 in accordance with the preferred embodiments includes many similar buttons as on the prior art receiver 100 of FIG. 1 for the sake of convenience and consistency in discussing the differences between the prior art and the preferred embodiments. The primary difference between prior art receiver 100 and receiver 200 is control inputs 250–280 that allow the radio receiver 200 to alter its operational mode when the frequency spectrum characteristics of the radio transmission changes. Note that this receiver 200 could be a stationary receiver (e.g., for a home stereo system) or a mobile receiver (e.g., for a car stereo system). For the specific example in FIG. 2, display 220 displays the same information for the current station as was displayed in the prior art display 120 in FIG. 1.

Radio receiver 200 includes a "Preference On" button 250 that, when pushed, enables the radio receiver to prefer a signal that matches a selected frequency spectrum signature, and that causes the radio receiver 200 to change its operational mode when the signal currently tuned to does not match the selected frequency spectrum signature. In one aspect of the preferred embodiments, a "smart scan" is now possible, where the radio receiver automatically detects which radio station (if any) is playing a program that matches the listener's preference. Thus, if the user prefers soft rock and selects soft rock as the preferred type of music, and if the preference on button 250 is pushed and the skip to preference button 280 is pushed, the radio receiver 200 will automatically scan to the next station that is broadcasting a soft rock song rather than stopping at each station. The manual scan override button 252 allows a user to override the preference settings to allow the user to listen to a program that does not match the preference settings. Thus, a user with a soft rock preference set may still listen to news or weather reports by pushing the manual scan override button 252.

Knobs 260 and 262 allow the listener to customize the threshold value and time, respectively, of a DJVO detector, which stands for Disc Jockey Voice Only. The DJVO detector is one specific implementation of a voice-only detection mechanism that allows discriminating between the frequency content of different radio signals, and changing the operational mode of radio receiver 200 according to the detected frequency content. The threshold for what constitutes "mostly voice" may be adjusted using knob 260. The time period for which a signal must be mostly voice before changing the DJVO outputs is adjustable using knob 262. An indicator 264 indicates when the DJVO detects a mostly voice program. If the radio receiver is set to mute the audio output when a mostly voice signal is received, indicator 264 serves as a mute indicator that helps the listener to visually distinguish between a muted program and a program that has long pauses of silence.

A set current to preference button 270 may be used to store the frequency spectrum characteristics of the current radio station being listened to as the preferred type of music. This is a very quick and easy way for a user to select a particular type of radio program as the preferred type. In the alternative, a user may select from several preset types of programs that are pre-programmed into the radio receiver 200 by selecting the desired type of program from a menu shown on display 220.

The skip to preference button 280 is used to implement a "smart scan" of radio stations that are currently broadcasting a signal that has frequency spectrum characteristics that match the preferred type of program that the user has selected. This smart scan ability greatly improves the convenience of using the radio receiver 200 by automatically ignoring all of the radio stations that are not currently broadcasting a signal that matches the preferred type of program that has been selected by the listener.

The term "radio program" is used very broadly herein to refer to any program or portion of a program that may be transmitted via radio signals. A radio program may include a song, a talk show program, a sporting event, a news report, etc.

Figure 3:
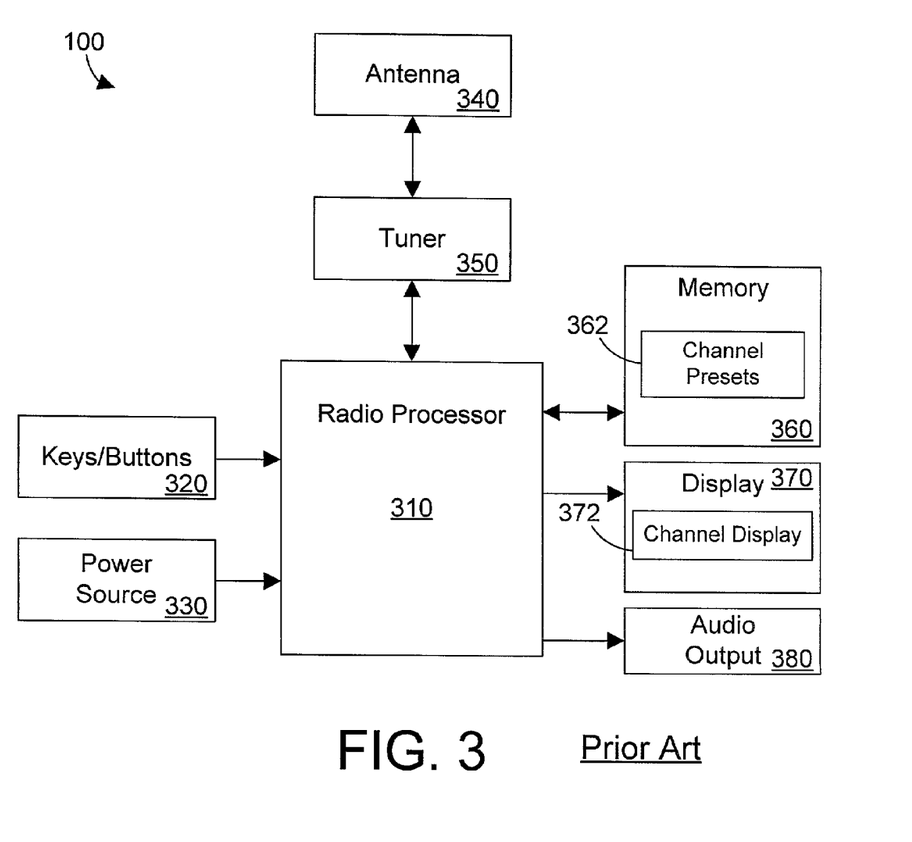
FIG. 3 is a block diagram of the prior art radio receiver in FIG. 1.

Referring now to FIG. 3, radio receiver 100 includes a radio processor 310 coupled to keys/buttons 320, a power source 330, an antenna 340, a tuner 350, a memory 360, a display 370, and an audio output 380. The keys/buttons 320 are the various keys and buttons that control the function of radio receiver 100, including the buttons shown in FIG. 1. The power source 330 is any suitable power source. For stationary radio receivers, the preferred power source is line power received from plugging a power cord into a standard power receptacle. For portable radio receivers, such as those located in vehicles, the preferred power source is 12 volt DC power from the vehicle's electrical system.

Antenna 340 is an antenna that is designed to receive AM and FM radio broadcasts. Tuner 350 is used to distinguish between the different radio broadcasts on the AM and FM frequency bands. Tuner 350 is used to select a current radio station to listen to, and this signal is then processed by radio processor 310 and output to the audio output 380.

Memory 360 includes station presets 362. Station presets 362 are the stations that are assigned to the preset buttons 148 of FIG. 1. The station presets are typically programmed by a user to allow instantly tuning to the station at the press of a preset button, as is known in the art.

Radio processor 310 is coupled to an audio output 380, which is suitably coupled to an appropriate audio device, such as one or more speakers. The audio output 380 is the radio program that is converted to audio signals so the radio program can be heard by the user. Audio output 380 is typically a low-level signal that is subsequently amplified and then supplied to speakers for the listener to hear the radio program currently playing on the selected radio station. Note, however, that the audio output 380 may be a signal that is amplified, either by radio processor 310 or by suitable circuitry coupled to radio processor 310 or tuner 350, and that the muting of the audio signal may comprise muting of a low-level audio signal before amplification, or muting of the amplified audio signal. Of course, muting of a low-level audio signal also accomplishes the muting of the amplified audio signal as well.

Display 370 includes the station display 372 that displays the currently-tuned station, such as 95.1 FM as shown in FIG. 1.

Figure 4:
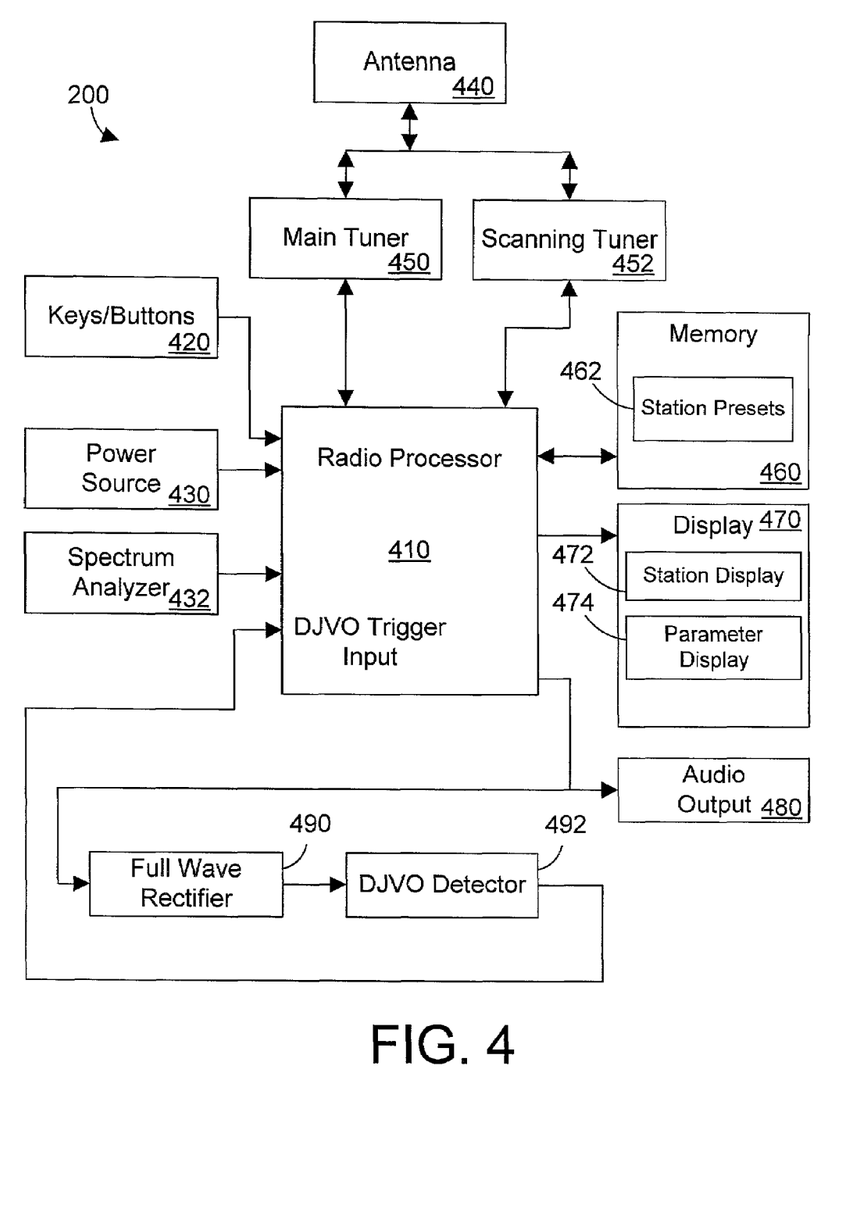
FIG. 4 is a block diagram of the radio receiver of FIG. 2 in accordance with one preferred embodiment.

Referring now to FIG. 4, a radio receiver 200 in accordance with the preferred embodiments includes a radio processor 410, keys/buttons 420, a power source 430, a spectrum analyzer 432, an antenna 440, a main tuner 450, a scanning tuner 452, a memory 460, a display 470, an audio output 480, a full wave rectifier 490, and a voice-only detector 492, referred to herein as a DJVO detector. DJVO detector 492 allows discriminating between the frequency content of different radio signals, and changing the operational mode of radio receiver 200 according to the detected frequency content.

The keys/buttons 420 include the keys and buttons shown in FIG. 2 and discussed above. The power source 430 is preferably similar to the power source 330 in FIG. 3. The spectrum analyzer 432 is preferably an off-the-shelf frequency spectrum analyzer, such as those used in graphic equalizers. One suitable spectrum analyzer is the Hitachi 5G1 HD38755A67. Spectrum analyzer 432 takes an audio input, such as from main tuner 450 or scanning tuner 452, and outputs values for a number of different frequency bands (typically seven or nine) that characterize the frequency spectrum of the input signal. Radio processor 410 reads the output of spectrum analyzer 432, thereby allowing the radio processor 410 to determine the frequency spectrum of an input signal of interest (e.g., from either main tuner 450 or scanning tuner 452). This frequency spectrum may then be compared against a selected frequency spectrum signature to see if they match within predetermined criteria.

Antenna 440 is coupled to both main tuner 450 and scanning tuner 452. The most preferred embodiment includes two different tuners so that the scanning tuner 452 can be constantly scanning other stations for signals that match the selected frequency spectrum signature while the main tuner 450 is tuned to a station that the user is currently listening to. By providing two separate tuners, the scan for a new station that has a signal that matches the selected frequency spectrum signature may be done very quickly. Of course, a single tuner could be used to scan for a suitable station after the radio processor 410 decides a new station is needed, but the response time for finding a new suitable station would cause a noticeable delay in switching between the current station and the next desirable station.

Memory 460 is suitably similar to memory 360 shown in FIG. 3 described above. Display 470 includes a station display 472 and a parameter display 474. Parameter display 474 allows a user to view menu choices for selecting a pre-defined type of radio program as the selected frequency spectrum signature. In addition, parameter display 474 may include indicators that indicate the state of the various control buttons and keys 250–280.

Audio output 480 is suitably similar to audio output 380 for the prior art radio receiver discussed above with reference to FIG. 3. The audio output from radio processor 410 is fed into a full wave rectifier 490, which converts the audio signals to a rectified waveform. Most modern radio stations use a compander (compressor/expander) that increases (expands) signal strength when the sound becomes quiet and that cuts (compresses) the signal strength when the sound becomes loud. A voice program run through a compander will thus have deeper periods of silence between words and sentences due to delay in compander transitions that will not exist in a musical program, and that can therefore be used to identify when a signal is mostly voice. Note that the application of the present invention is not limited to radio signals that use a compander. Proper adjustment of the apparatus and method of the present invention will result in proper operation even in the absence of a compander.

The output of the full wave rectifier 490 goes to a DJVO detector 492. DJVO detector 492 is one specific implementation of a voice-only detector mechanism. When DJVO detector 492 detects that the full-wave rectified audio output falls below a preset threshold value (DJVO threshold value) for a predetermined period of time (DJVO time threshold), it asserts its DJVO trigger signal to the radio processor 410, which signals the processor 410 to change the operational mode of the radio receiver 440. Depending on the user's selected preferences, the radio processor 410 may simply mute the audio output 480, or may switch main tuner 450 to a new radio station identifier by scanning tuner 452 to be playing a program that matches the user's selected program type.

Figure 5:
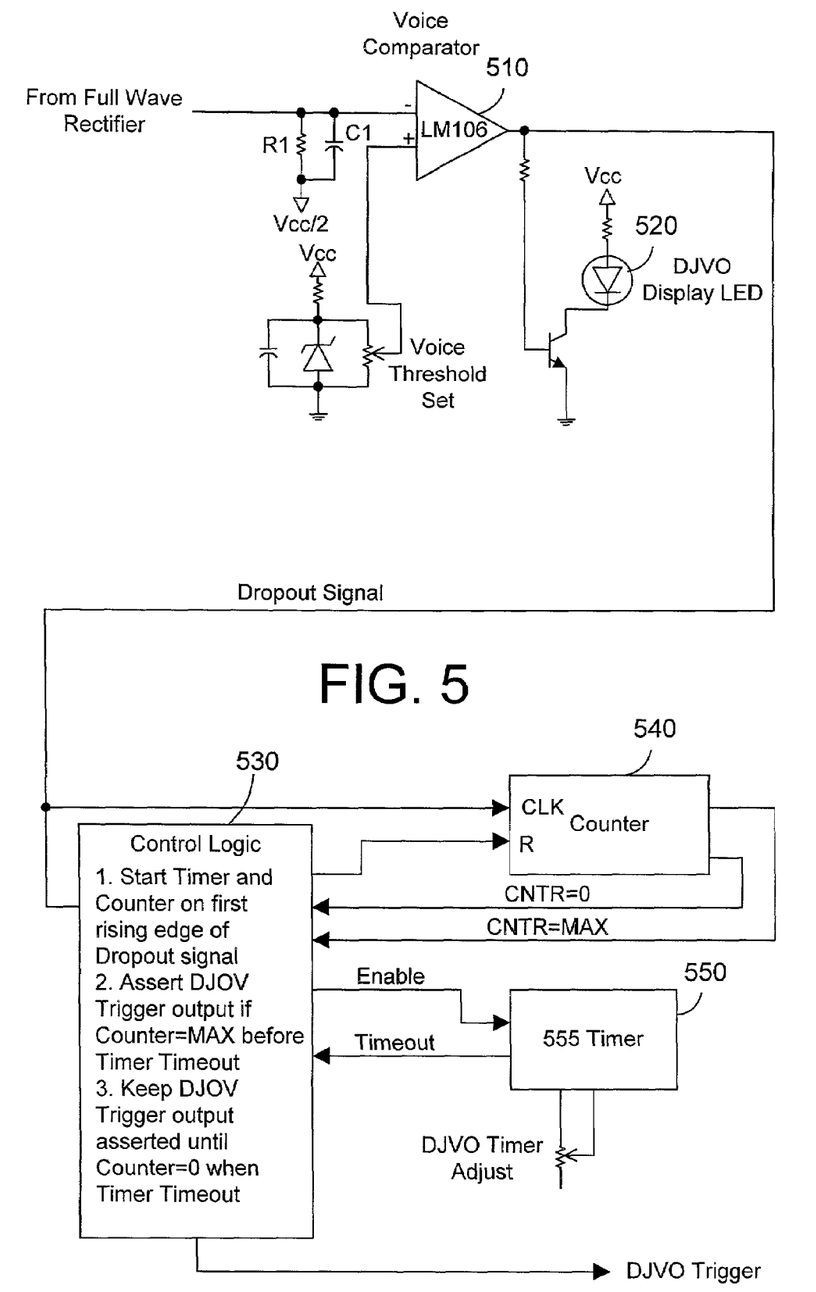
FIG. 5 is a schematic diagram showing one specific implementation of the DJVO detector of FIG. 4 in accordance with the preferred embodiments.

One suitable implementation of the DJVO detector in accordance with the preferred embodiments is shown in FIG. 5. The audio output that has been full wave rectified is input into a voice comparator 510. Connected to the same input is a resister R1 and a capacitor C1 whose values determine a time constant that is preferably 10–25 milliseconds (ms). This signal is compared to a voice threshold signal that is preferably set to a value that the compander low noise level will cross the threshold but normal musical programs will not. The voice comparator 510 asserts its output high to signal a dropout below the voice threshold value. When the voice comparator output is high, the DJVO display LED 520 is lit to indicate that the DJVO detector is currently detecting a drop-out.

The dropout signal in FIG. 5 is then fed to control logic 530 that is coupled to a counter 540 and a timer 550. The counter 540 preferably has a maximum count that may be selected and adjusted by the user, but a fixed counter could be used as well. The timer 550 has a period that is adjustable by the user using DJVO timer adjust. Control logic 530 is a simple state machine that could be implemented in any suitable manner, including discrete logic or programmable logic devices. When a dropout first occurs (i.e., on the first rising edge of the dropout signal), the control logic starts the timer by asserting the enable signal to the timer, and starts the counter counting the dropouts by negating its reset output to the counter (step 1). If the voice comparator detects that the counter is at its maximum value before the timer times out, the control logic asserts its DJVO trigger output (step 2) to the radio processor to indicate that a change in operational mode is needed. Once the DJVO trigger output is asserted, it remains asserted until the counter has a count of zero when the timer times out (step 3). Because step 2 of the control logic requires a maximum count to assert the DJVO trigger output, and because step 3 of the control logic requires a count of zero before de-asserting the DJVO trigger output, the DJVO detector of FIG. 5 provides hysteresis that assures the DJVO trigger output does not change excessively around the threshold.

Figure 6:
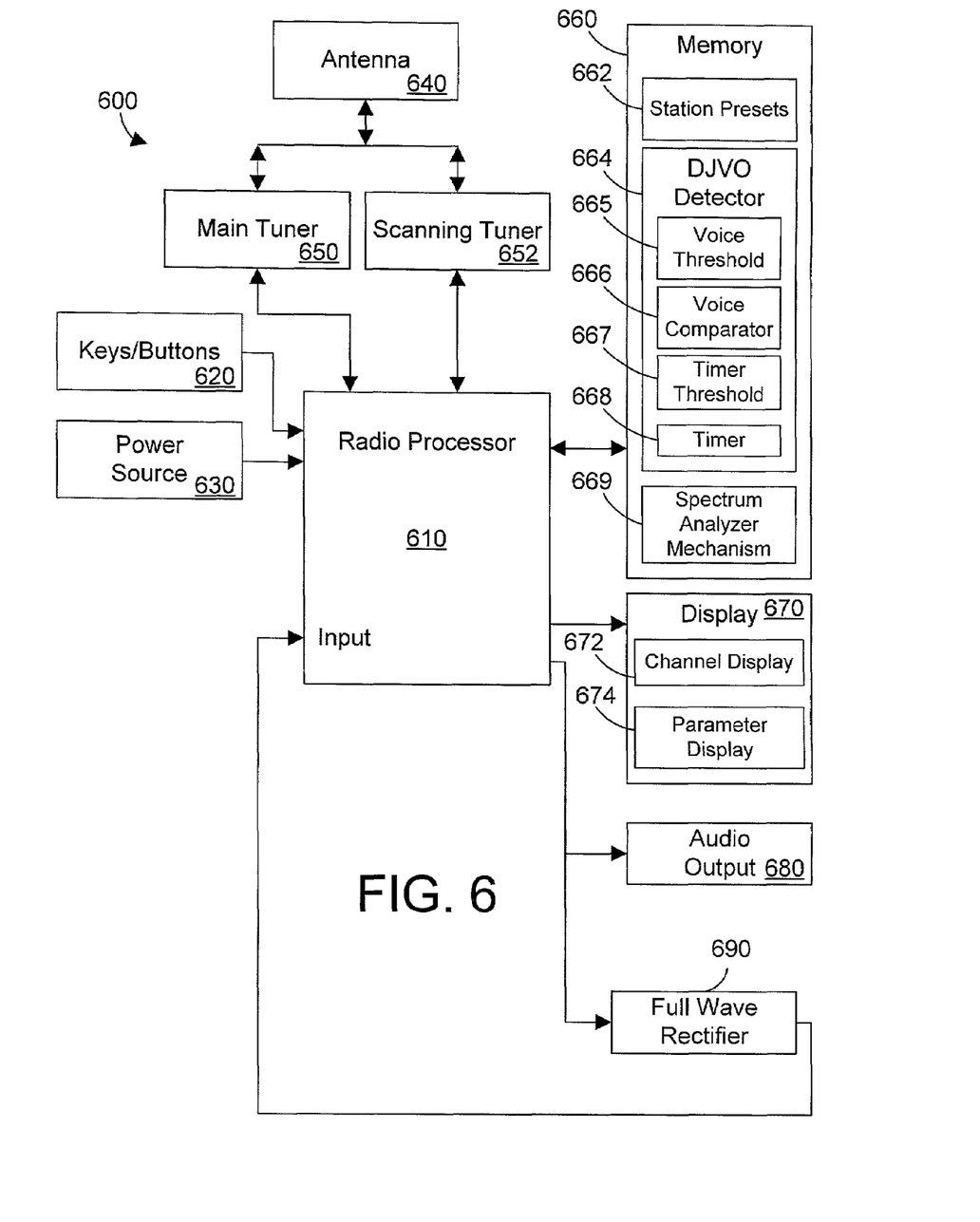
FIG. 6 is a block diagram of the radio receiver of FIG. 2 in accordance with another preferred embodiment.

FIG. 6 illustrates an alternative embodiment that is similar in function to the radio receiver 400 of FIG. 4, but implements these functions in a different way. Radio receiver 600 performs much of the analysis of the rectified audio output in software. As a result, radio processor 610 takes the full wave rectified audio output signal and processes it to see if the operational mode of the radio receiver needs to change. The memory 660 thus includes the station presets 662 as before, but additionally includes a DJVO detector 664 implemented in software that operates according to a voice threshold 665, voice comparator 666, timer threshold 667, and timer 668 to determine when to change operational modes. Implementing the DJVO in software reduces the hardware, but at the cost of software that is significantly more expensive to develop. Note that memory 660 also includes a spectrum analysis mechanism 669 that analyzes the audio outputs of main tuner 650 and scanning tuner 652 to produce a frequency spectrum characterization for these signals, rather than providing a hardware spectrum analyzer.

Figure 7:
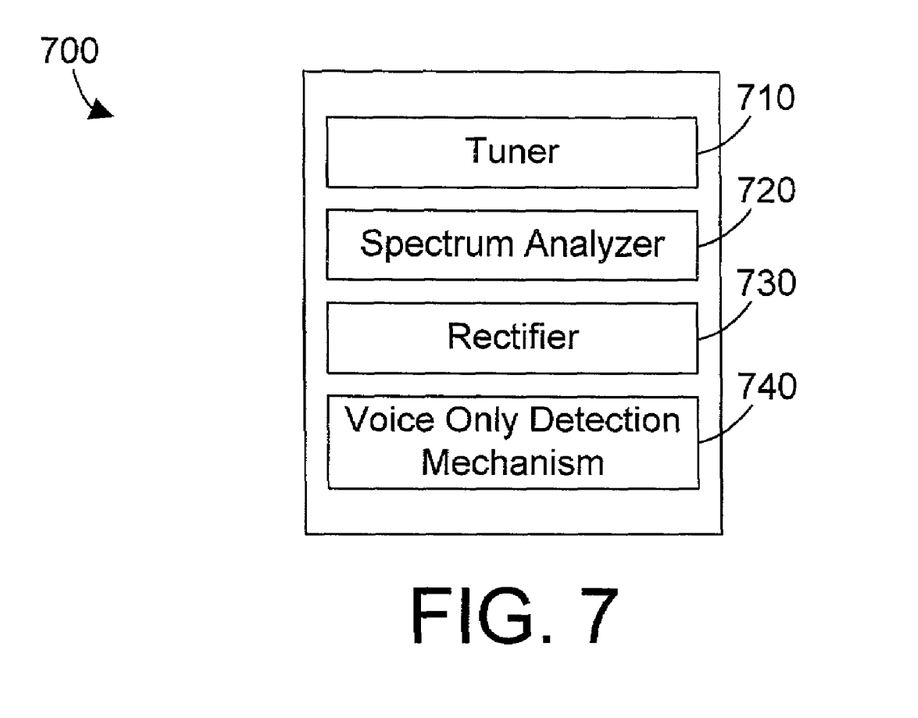
FIG. 7 is a block diagram showing functions that may be performed in accordance with the preferred embodiments.

FIG. 7 shows a block diagram showing a radio receiver 700 with functions that are needed to accomplish both the muting and smart scanning described in the preferred embodiments. The tuner 710 receives the radio signals, spectrum analyzer 720 analyzes the radio signals and generates a frequency spectrum characterization or "signature" for the radio signals. Rectifier 730 corresponds to the full wave rectifier 490 and 690 of FIGS. 4 and 6, respectively. Voice only detection mechanism 740 corresponds to the DJVO detector 492 in FIG. 4 or 664 in FIG. 6. By providing these functions as described herein with respect to the hardware implementation in FIG. 4, the radio receiver 700 may change its operational mode (such as muting the signal or changing to a new station) when the incoming radio signal no longer matches the preferred frequency spectrum signature. Note that the general block diagram of FIG. 7 describes both the mostly hardware implementation of FIG. 4 as well as the mostly software implementation of FIG. 6.

Figure 8:
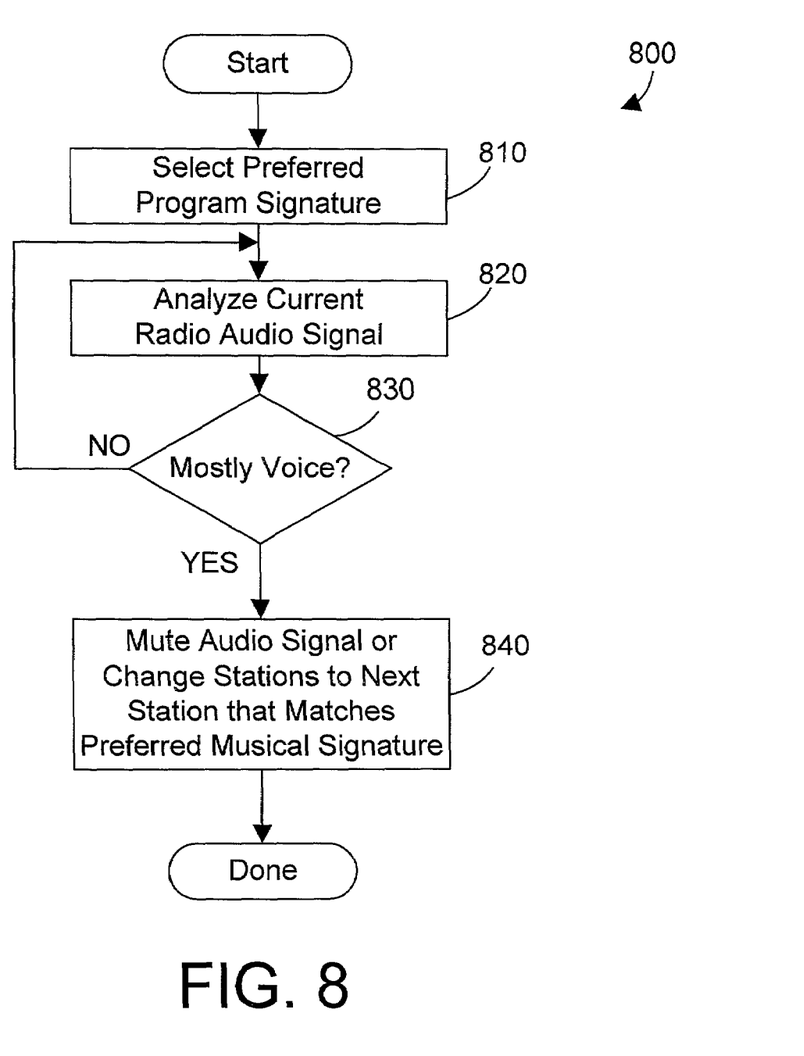
FIG. 8 is a flow diagram that shows the steps that may be performed in accordance with the preferred embodiments to change the operational mode of the radio receiver when mostly voice is detected.

Referring now to FIG. 8, a method 800 in accordance with the preferred embodiments begins by selecting a preferred frequency spectrum signature, referred to in shortened form as a program signature (step 810). The current radio audio signal is then analyzed (step 820). If the current radio audio signal is mostly voice (step 830=YES), the operational mode of the radio receiver is changed by either muting the audio signal or by changing stations to the next station that matches the preferred program signature (step 840). If the current radio station is not mostly voice (step 830=NO), the monitoring of the current radio audio signal continues (step 820). Note that a variation of method 800 switches the YES and NO labels of step 830, allowing a listener to listen to talk radio while muting musical commercials, or changing stations when a musical commercial is detected.

Figure 9:
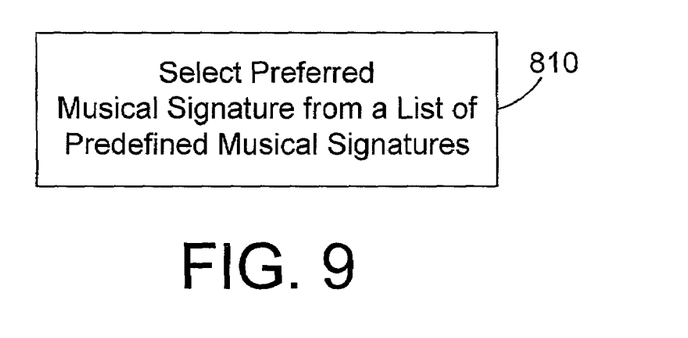
FIG. 9 is a flow diagram of one specific implementation of step 810 in FIG. 8.
Figure 10:
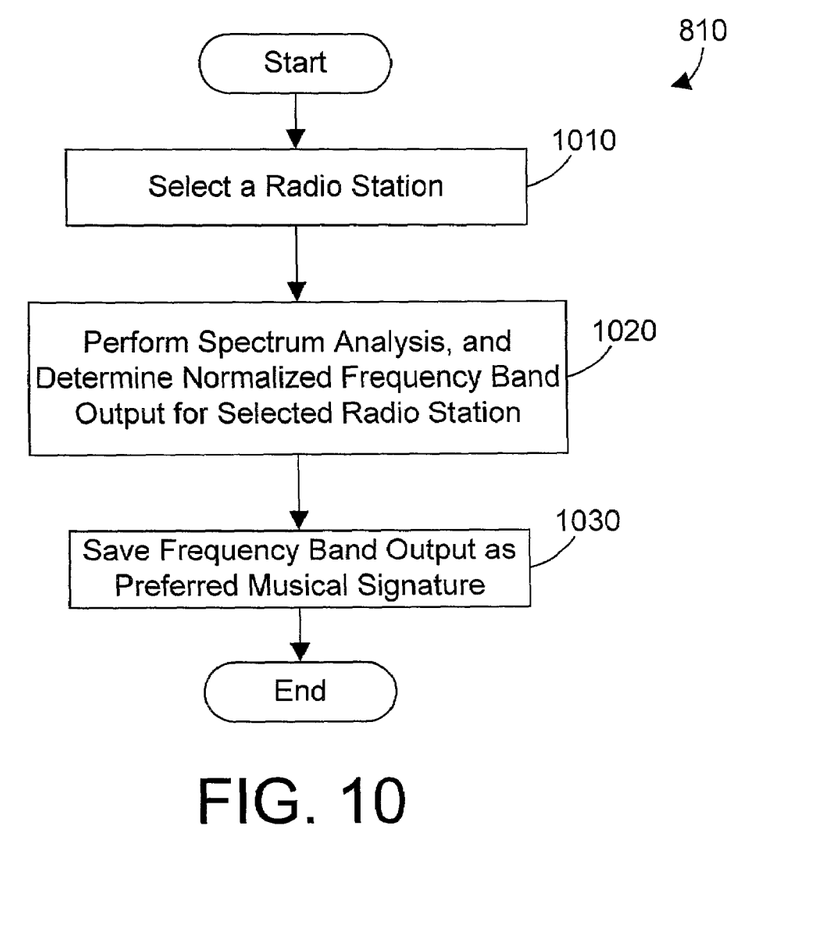
FIG. 10 is a flow diagram of another specific implementation of step 810 in FIG. 8.

Referring to FIG. 9, one suitable way to implement step 810 in FIG. 8 is to select a preferred musical signature from a list of predefined musical signatures that is preferably displayed to a user on display 220 of FIG. 2. Referring to FIG. 10, another suitable way to implement step 810 in FIG. 8 begins by selecting a radio station (step 1010), performing a spectrum analysis and determining a normalized frequency band output for the selected radio station (step 1020), and by saving the frequency band output as the preferred musical signature (step 1030). Steps 1010–1030 of FIG. 10 are the steps that are performed when a user selects a radio station and presses the "set current to preference" button 270 shown in FIG. 2.

Figure 11:
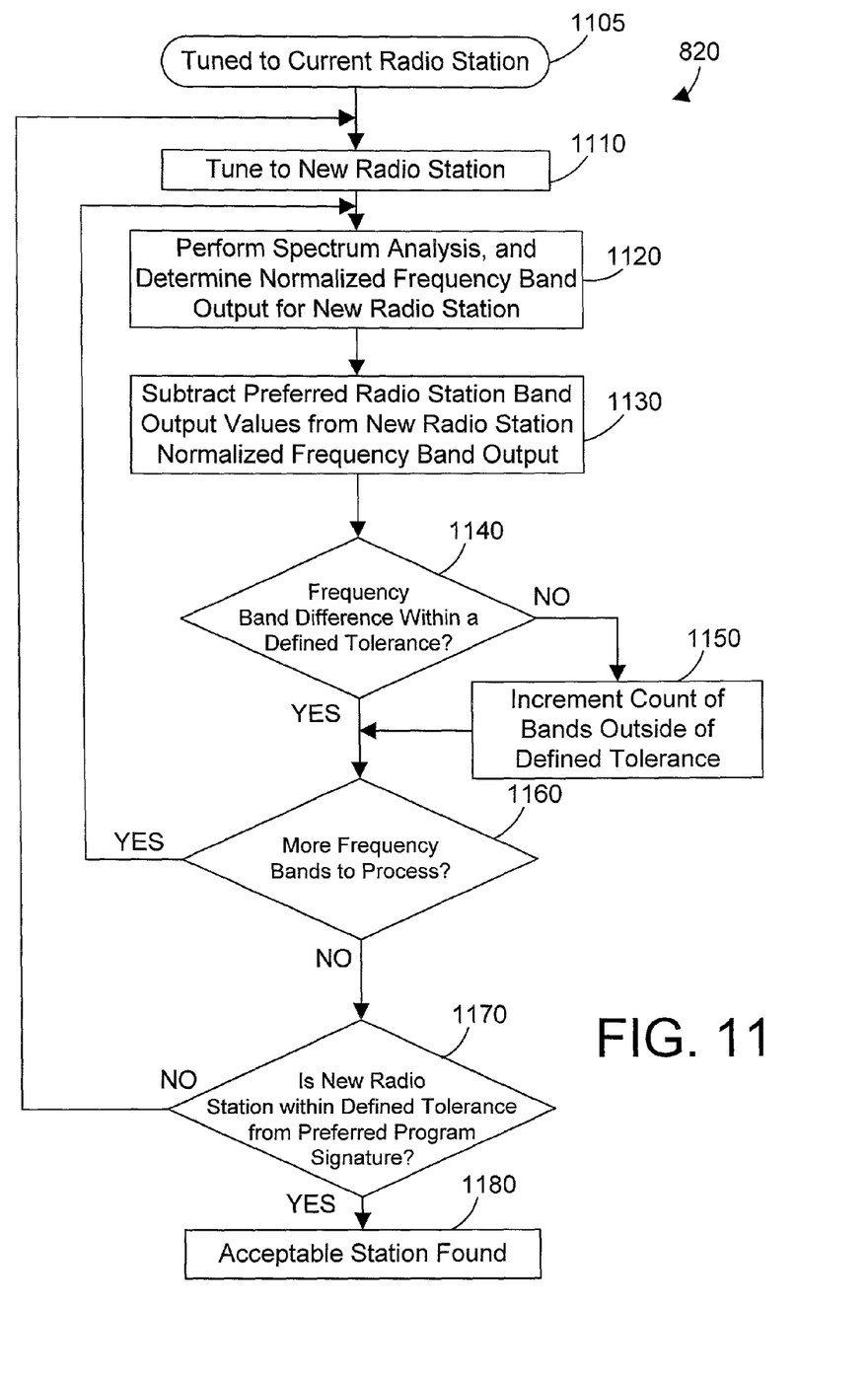
FIG. 11 is a flow diagram of a method for changing operational modes of a radio receiver in accordance with the preferred embodiments.

Referring now to FIG. 11, one specific implementation of step 820 in FIG. 8 is shown. We assume that the tuner is tuned to a current radio station (step 1105). A new radio station is then selected and tuned in (step 1110), preferably using the scanning tuner. A spectrum analysis is then performed, and the results are normalized to a frequency band for the new radio station (step 1120). The band output values that correspond to the preferred frequency spectrum signature are then subtracted from the new radio station normalized frequency band output (step 1130). If the frequency band difference is within a defined tolerance (step 1140=YES), step 1160 then determines if there are more frequency bands to process. If the frequency band difference is not within the defined tolerance (step 1140=NO), a count of bands outside of the defined tolerance is incremented (step 1150). When there are no more frequency bands to process (step 1160=NO), step 1170 determines whether the radio station is within a defined tolerance from the preferred program signature (step 1170). If not (step 1170=NO), the next radio station is selected (step 1110), and the process continues, searching for a station with a frequency spectrum that matches the selected program signature. If so (step 1180=YES), the current radio station is an acceptable station with respect to the defined tolerances, so an acceptable station has been found (step 1180).

The preferred embodiments disclosed herein greatly improve the convenience of using a radio receiver by analyzing an audio output of a radio station, and by either muting the audio output or changing to a different station when the audio output indicates the broadcast is not longer the preferred type.

One skilled in the art will appreciate that many variations are possible within the scope of the present invention. Thus, while the invention has been particularly shown and described with reference to preferred embodiments thereof, it will be understood by those skilled in the art that these and other changes in form and details may be made therein without departing from the spirit and scope of the invention.

We claim:

1. A radio receiver comprising:
a tuner that provides an audio output for a selected radio station;
a voice-only detection mechanism that monitors the audio output of the tuner, and that provides a first output indication when the audio output of the tuner is mostly voice, and that provides a second output indication when the audio output of the tuner is mostly music;
a radio processor coupled to the voice-only detection mechanism, the radio processor changing an operational mode of the radio receiver according to the first and second output indications of the voice-only detection mechanism, wherein the radio processor changes the tuner to a different radio station according to the first and second output indications of the voice-only detection mechanism;
a spectrum analyzer coupled to the audio output of the tuner, the spectrum analyzer storing a preferred frequency spectrum signature for a radio signal;
a second tuner coupled to the radio processor;
the radio processor scanning available radio stations using the second tuner to locate a program that matches the preferred frequency spectrum signature within predetermined criteria, and changing to a radio station that matches the preferred frequency spectrum signature when the first output indication is received.

2. A radio receiver comprising:
a first tuner that provides a first audio output for a selected radio station;
an amplifier coupled to the audio output of the first tuner that provides an amplified audio signal to at least one speaker;
a second tuner that provides a second audio output;
a spectrum analyzer coupled to the first and second audio outputs, the spectrum analyzer storing a preferred frequency spectrum signature for a radio signal;

a voice-only detection mechanism that monitors the audio output of the first tuner, and that provides a first output indication when the audio output of the first tuner is mostly voice, and that provides a second output indication when the audio output of the first tuner is not mostly voice;

a radio processor coupled to the voice-only detection mechanism and coupled to the second tuner, the radio processor scanning available radio stations using the second tuner to locate a program that matches the preferred frequency spectrum signature within predetermined criteria, and changing the first tuner to a radio station that is currently broadcasting a program that matches the preferred frequency spectrum signature when the first output indication is received.

3. A method for changing an operational mode of a radio receiver, the method comprising the steps of:
 (A) analyzing an audio output of a tuner;
 (B) providing a first output indication when the audio output is mostly voice;
 (C) providing a second output indication when the audio output is mostly music;
 (D) changing the operational mode of the radio receiver according to the first and second output indications;
 (E) storing a preferred frequency spectrum signature for a radio signal;
 (F) scanning available radio stations to locate a program that matches the preferred frequency spectrum signature within predetermined criteria;
 (G) wherein step (D) changes the operational mode of the radio receiver by changing the tuner to a radio station that is currently broadcasting a program that matches the preferred frequency spectrum signature.

4. A method for changing the operational mode of a radio receiver, the method comprising the steps of:
 providing a first audio output for a selected radio station;
 storing a preferred frequency spectrum signature for a radio signal;
 monitoring the first audio output, and providing a first output indication when the first audio output is mostly voice, and providing a second output indication when the first audio output is not mostly voice;
 scanning available radio stations to locate a program that matches the preferred frequency spectrum signature within predetermined criteria; and
 changing the first audio output to a different radio station that is currently broadcasting a program that matches the preferred frequency spectrum signature when one of the first and second output indications is received.

* * * * *